United States Patent
Nakanishi et al.

(10) Patent No.: US 8,570,083 B2
(45) Date of Patent: *Oct. 29, 2013

(54) PULSE WIDTH MODULATION CIRCUIT AND SWITCHING AMPLIFIER USING THE SAME

(75) Inventors: Yoshinori Nakanishi, Neyagawa (JP); Mamoru Sekiya, Neyagawa (JP)

(73) Assignee: Onkyo Corporation, Neyagawa-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/196,406

(22) Filed: Aug. 22, 2008

(65) Prior Publication Data

US 2009/0066377 A1    Mar. 12, 2009

(30) Foreign Application Priority Data

Sep. 10, 2007    (JP) ................................. 2007-233946

(51) Int. Cl.
| | |
|---|---|
| *H03K 3/017* | (2006.01) |
| *H03K 5/04* | (2006.01) |
| *H03K 7/08* | (2006.01) |

(52) U.S. Cl.
USPC ........... 327/172; 327/173; 327/174; 327/175; 327/176

(58) Field of Classification Search
USPC ..................... 327/31–38, 94, 172, 291, 298; 375/238–239; 330/10
See application file for complete search history.

(56) References Cited

U.S. PATENT DOCUMENTS

| | | | | |
|---|---|---|---|---|
| 4,687,998 | A * | 8/1987 | Takatori et al. | 327/126 |
| 4,754,226 | A * | 6/1988 | Lusignan et al. | 327/356 |
| 7,102,405 | B2 * | 9/2006 | Hisamoto et al. | 327/172 |
| 7,312,657 | B2 | 12/2007 | Kurokawa | |
| 2006/0152184 | A1 | 7/2006 | Matsushita | |
| 2008/0174351 | A1 | 7/2008 | Nakanishi et al. | |

FOREIGN PATENT DOCUMENTS

| | | |
|---|---|---|
| EP | 1 947 767 | 7/2008 |
| JP | 9-023641 | 1/1997 |
| JP | 2004-320097 | 11/2004 |
| JP | 05-275995 | 10/2005 |
| JP | 2005-303814 | 10/2005 |
| JP | 2006-197247 | 7/2006 |
| JP | 2007-329698 | 12/2007 |
| JP | 2007-336361 | 12/2007 |
| JP | 4100455 | 6/2008 |

* cited by examiner

*Primary Examiner* — Lincoln Donovan
*Assistant Examiner* — Colleen O Toole
(74) *Attorney, Agent, or Firm* — Renner, Otto, Boiselle & Sklar, LLP

(57) ABSTRACT

A pulse width modulation circuit of the present invention changes a voltage of a charging circuit based on an input signal voltage and in synchronization with a first switching signal; changes, during a predetermined second period following a first period during which the voltage of the charging unit is changed, the voltage of the charging unit in an opposite direction to a direction in which the voltage is changed during the first period, based on a constant bias current; detects time starting from when the second period starts to when the voltage of the charging unit reaches a predetermined reference voltage; and generates, based on the detected time which is repeatedly output each time the first switching signal is output, a pulse signal having a pulse width of the time.

10 Claims, 7 Drawing Sheets

US 8,570,083 B2

PULSE WIDTH MODULATION CIRCUIT AND SWITCHING AMPLIFIER USING THE SAME

BACKGROUND OF THE INVENTION

1. Field of the Invention

The present invention relates to a pulse width modulation circuit for performing, for example, pulse width modulation (PWM) on an audio signal to output the modulated signal, and a switching amplifier using the same (e.g., an audio amplifier).

2. Description of the Related Art

For example, a type of a conventional switching amplifier proposed in the art uses a pulse width modulation circuit for performing pulse width modulation on an audio signal as the input signal to output the modulated signal (see, for example, Japanese Laid-Open Patent Publication No. 2004-320097). With the switching amplifier, a predetermined power source voltage is switched ON and OFF based on the modulated signal output from the pulse width modulation circuit, and the output signal switched ON and OFF is output to a load (e.g., a speaker) through a low-pass filter, for example.

FIG. 7 shows a configuration of an example of a conventional switching amplifier. The switching amplifier includes a pulse width modulation circuit 51 connected to an audio signal generation source AU, a switching circuit 52, and a low-pass filter 53. With the switching amplifier, an audio signal $e_S$ output from the audio signal generation source AU is input to the pulse width modulation circuit 51, where a pulse width modulation is performed on the amplitude of the audio signal $e_S$. As a result, a modulated signal OUT1 and a modulated signal OUT2 in opposite phase to the modulated signal OUT1 are output to the switching circuit 52.

In the switching circuit 52, the positive and negative power source voltages $+V_D$ and $-V_D$ are alternately switched ON and OFF by switches SW-a and SW-b, respectively, based on the modulated signals OUT1 and OUT2. The output being switched ON and OFF passes through the low-pass filter 53, where a high-frequency component thereof is removed, and is supplied to a load (not shown) as an output signal $V_O$.

FIG. 8 is a circuit diagram showing a schematic configuration of the pulse width modulation circuit 51 shown in FIG. 7.

The pulse width modulation circuit 51 is an integration-type pulse width modulation circuit using an astable multivibrator, for example, for performing a pulse width modulation on the audio signal $e_S$ as the input signal to produce and output the modulated signal OUT1, for example.

As shown in FIG. 8, the pulse width modulation circuit 51 includes a bias current source 54, a modulation circuit 55 connected to the bias current source 54, and a pulse generation circuit 56 connected to the modulation circuit 55. The bias current source 54 is for supplying a bias current to the modulation circuit 55.

The modulation circuit 55 is implemented by a so-called differential amplifier circuit, and includes resistors R51 and R52 the first ends of which are connected to each other, and transistors Q51 and Q52 connected to the second ends of the resistors R51 and R52, respectively. The modulation circuit 55 varies the current distribution ratio between first and second currents I1 and I2, which flow through the transistors Q51 and Q52, respectively, according to the audio signal $e_S$.

The pulse generation circuit 56 is a circuit for producing a pulse signal which is to be modulated, i.e., a carrier of a PWM signal, and includes first and second charge capacitors C51 and C52, first and second inverters INV51 and INV52, first and second diodes D51 and D52, and a power source voltage 57. The pulse generation circuit 56 charges the first and second charge capacitors C51 and C52 based on the first and second currents I1 and I2 supplied from the modulation circuit 55. The pulse generation circuit 56 outputs the modulated signal OUT1 whose pulse width corresponds to the charging time of the first charge capacitor C51. Note that the predetermined power source voltage 57 is connected to the cathode side of each of the first and second diodes D51 and D52.

With the conventional pulse width modulation circuit 51, the frequency f of the carrier of a PWM signal (hereinafter referred to as the "carrier frequency") is dependent on the bias current of the bias current source 54, the capacitances of the first and second capacitors C51 and C52, the threshold voltages Vth of the first and second inverters INV51 and INV52, etc. Therefore, where the pulse width modulation circuit 51 is used in a multi-channel switching amplifier having a plurality of channels, the carrier frequency f will vary slightly among different channels if there are variations in the capacitances of the first and second capacitors C51 and C52, etc.

As described above, with the conventional pulse width modulation circuit 51, circuits for different channels separately generate the carrier frequency f. Therefore, the carrier frequency f will vary among different channels. Where the carrier frequency f varies slightly among different channels, a beat component between signals to be modulated (carriers) is mixed in the audio frequency component, and a beat sound may be output as noise. Therefore, a sound whose sound quality is slightly altered is output from the load (speaker) as noise within the audible range.

The present invention has been made in view of the above, and it is an object of the present invention to provide a pulse modulation circuit with which the carrier frequency is made substantially constant, thus allowing for an appropriate pulse width modulation, and a switching amplifier using the same.

SUMMARY OF THE INVENTION

A pulse width modulation circuit according to a preferred embodiment of the present invention includes: a first voltage control unit that changes a voltage of a charging unit based on an input signal voltage and in synchronization with a predetermined clock signal; a second voltage control unit that changes, during a predetermined second period following a first period during which the voltage of the charging unit is changed by the first voltage control unit, the voltage of the charging unit in an opposite direction to a direction in which the voltage is changed during the first period, based on a constant bias current; a detecting unit that detects time starting from when the second period starts to when the voltage of the charging unit reaches a predetermined reference voltage; and a pulse signal generating unit that generates, based on the detected time which is repeatedly output from the detecting unit for each clock signal, a pulse signal having a pulse width of the time.

According to this configuration, the voltage of the charging unit is changed during the first period based on the voltage of an input signal (e.g., an audio signal) and in synchronization with the predetermined clock signal. During the predetermined second period following the first period, the voltage of the charging unit is changed in the opposite direction to a voltage change direction present during the first period, based on the constant bias current. Then, time starting from when the second period starts to when the voltage of the charging unit reaches the predetermined reference voltage is detected and based on detected time which is repeatedly output for each clock signal, a pulse signal having a pulse width of the time is generated.

Preferably, the first voltage control unit charges the charging unit in a minus direction with respect to a ground potential.

Preferably, the second voltage control unit discharges the charging unit in a plus direction with respect to the ground potential.

Preferably, the detecting unit includes a computing unit that computes a NOR of the clock signal and the voltage of the charging unit, and the pulse signal generating unit generates the pulse signal based on an output from the computing unit.

Preferably, the pulse width modulation circuit further includes a clock generating unit that generates the clock signal.

A pulse width modulation circuit suitable for a multi-channel switching amplifier according to a preferred embodiment of the present invention includes a plurality of said pulse width modulator circuits and a single clock generating unit.

A switching amplifier according to a preferred embodiment of the present invention includes: the above-described pulse width modulation circuit; a voltage source that outputs a predetermined power source voltage; and a switching circuit that switches ON and OFF the predetermined power source voltage which is supplied from the voltage source, based on a modulated signal output from the pulse width modulation circuit.

DETAILED DESCRIPTION OF THE PREFERRED EMBODIMENTS

A preferred embodiment of the present invention will be specifically described below with reference to the accompanying drawings.

Figure 1:
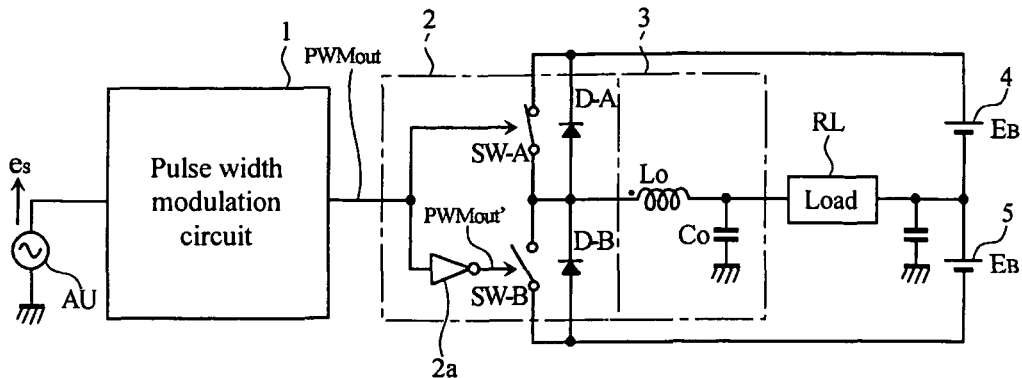
FIG. 1 is a configuration diagram showing a switching amplifier to which a pulse width modulation circuit of the present invention is applied.
Figure 2:
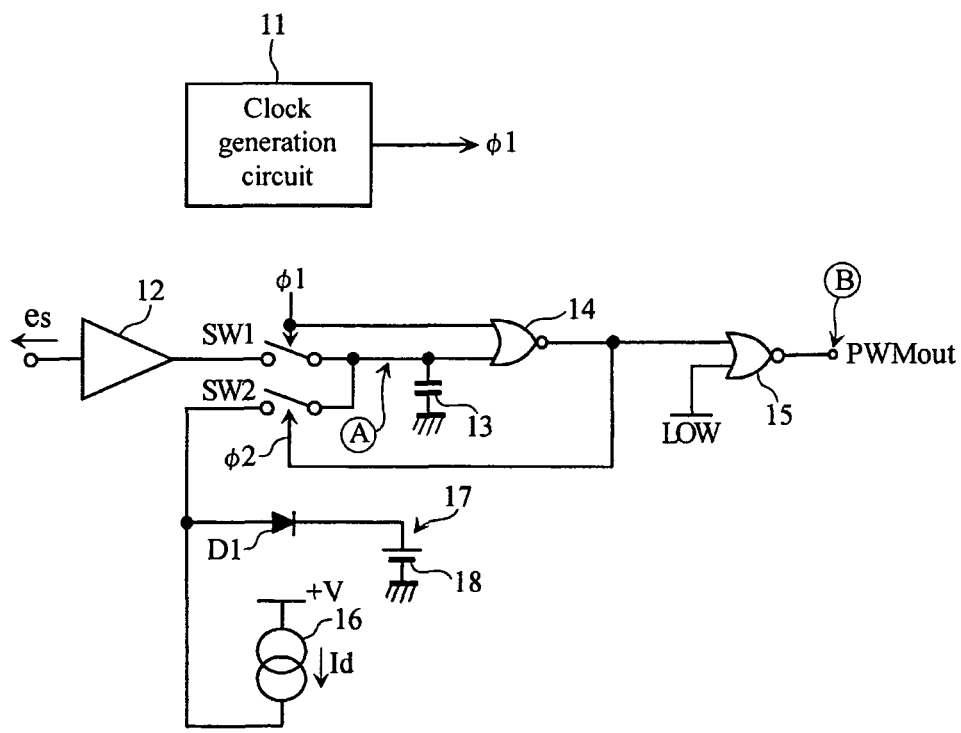
FIG. 2 is a block circuit diagram showing one embodiment of the pulse width modulation circuit shown in FIG. 1.

FIG. 1 is a configuration diagram showing a switching amplifier within which a pulse width modulation (PWM) circuit according to the present invention is applied. FIG. 2 is a block circuit diagram showing one embodiment of the pulse width modulation circuit shown in FIG. 1. More particularly, the switching amplifier includes a pulse width modulation circuit 1 connected to an audio signal generation source AU; a switching circuit 2; a low-pass filter circuit 3; and a first power source 4 and a second power source 5 that supply positive and negative power source voltages $+E_B$ and $-E_B$, respectively. To an output of the low-pass filter circuit 3 is connected a speaker (not shown) represented as a load RL.

The pulse width modulation circuit 1 is for performing a pulse width modulation on an audio signal $e_S$ as an input signal output from the audio signal generation source AU, to generate and output a PWM signal PWMout. The PWM signal PWMout output from the pulse width modulation circuit 1 is input to the switching circuit 2.

In the switching circuit 2, the positive and negative power source voltages $+E_B$ and $-E_B$ are respectively supplied from the first power source 4 and the second power source 5 and the power source voltages $+E_B$ and $-E_B$ are alternately switched ON and OFF based on the modulated PWM signal PWMout. Specifically, the switching circuit 2 includes a switch element SW-A that performs an ON/OFF operation based on the PWM signal PWMout; an inverter 2a that inverts the phase of the PWM signal PWMout output from the pulse width modulation circuit 1; a switch element SW-B that performs an ON/OFF operation based on a PWM signal PWMout' obtained as a result of the inversion of the phase of the PWM signal PWMout by the inverter 2a; and reverse-current prevention diodes D-A and D-B respectively connected to both ends of the switch elements SW-A and SW-B.

The switch elements SW-A and SW-B alternately perform an ON/OFF operation by the PWM signal PWMout and the inverted PWM signal PWMout', respectively, and supply the positive and negative power source voltages $+E_B$ and $-E_B$ switched ON and OFF to the low-pass filter circuit 3 and the load RL.

The low-pass filter circuit 3 is configured by an LC circuit that includes a coil $L_0$ and a capacitor $C_0$. The low-pass filter circuit 3 is a circuit for removing a high-frequency component of an output signal output from the switching circuit 2 to supply a resulting output signal to the load RL. The low-pass filter 3 has a cut-off frequency of 60 kHz, for example. In the low-pass filter circuit 3, high-frequency components of the positive and negative power source voltages $+E_B$ and $-E_B$ switched ON and OFF are removed and a resulting output is supplied to the load RL and is thereby output as a sound from the load RL.

As shown in FIG. 2, the pulse width modulation circuit 1 is configured by a clock generation circuit 11; a buffer amplifier circuit 12; first and second switches SW1 and SW2; a charging circuit 13; first and second NOR circuits 14 and 15; a discharge bias current source 16; and a current bypass circuit 17.

The clock generation circuit 11 is a circuit for generating a first switching signal φ1. The first switching signal φ1 is a signal that goes to a high level only for a predetermined period of time (corresponding to the "first period" recited in the claims) at predetermined time intervals, and is used as a signal for switching between the ON/OFF operations of the first switch SW1. Note that the clock generation circuit 11 may be provided external to the pulse width modulation circuit 1 and may provide the first switching signal φ1 as an external clock signal to the pulse width modulation circuit 1.

Note also that in the following description, for convenience sake, as shown in FIGS. 3A to 3E and 4A to 4E, a certain period of time after the first switching signal φ1 goes to the high level for the first time is referred to as the "first period T1" and a certain period of time after the first switching signal φ1 goes to the high level for the second time is referred to as the "second period T2".

The buffer amplifier circuit 12 is a circuit for adjusting impedance with respect to the audio signal generation source AU (see FIG. 1) and accepting, as an input signal, and holding the audio signal $e_S$ which is supplied to the pulse width modulation circuit 1 from the audio signal generation source AU. The buffer amplifier circuit 12 is connected to the charging circuit 13 through the first switch SW1. The buffer amplifier circuit 12 draws a voltage at one end of the charging circuit 13 at timing at which the first switch SW1 is operated to ON and charges the charging circuit 13 in a minus direction with respect to a ground potential.

Figure 3:
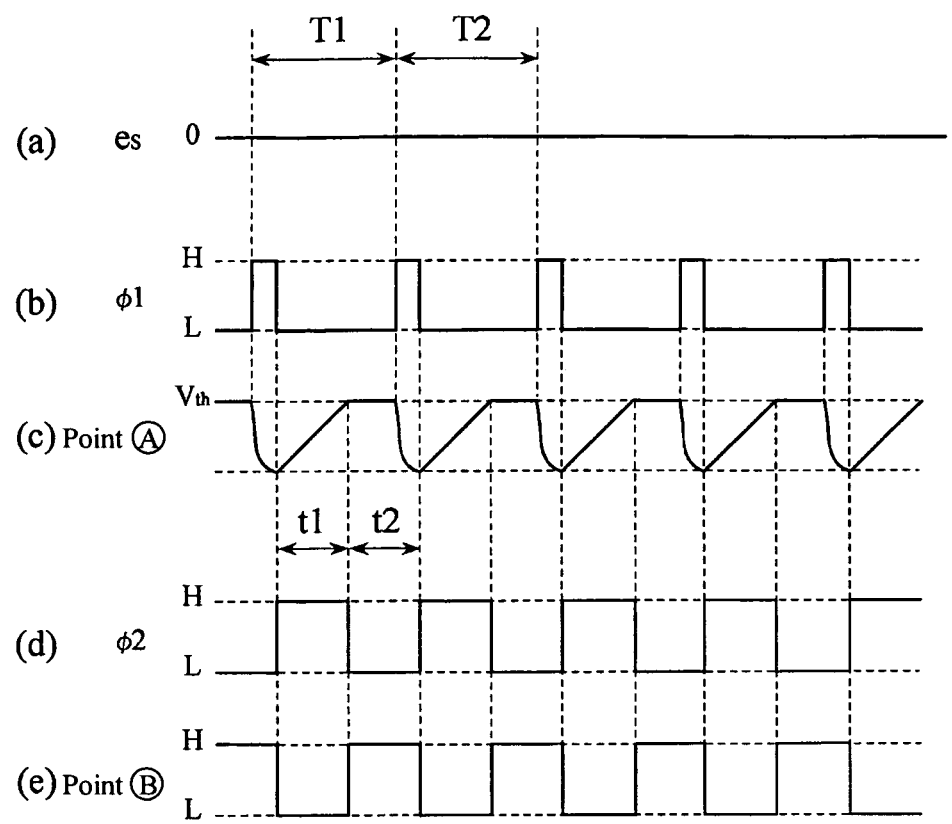
FIGS. 3A to 3E are timing charts showing voltage waveforms of signals for the case in which an audio signal is a no-signal.
Figure 4:
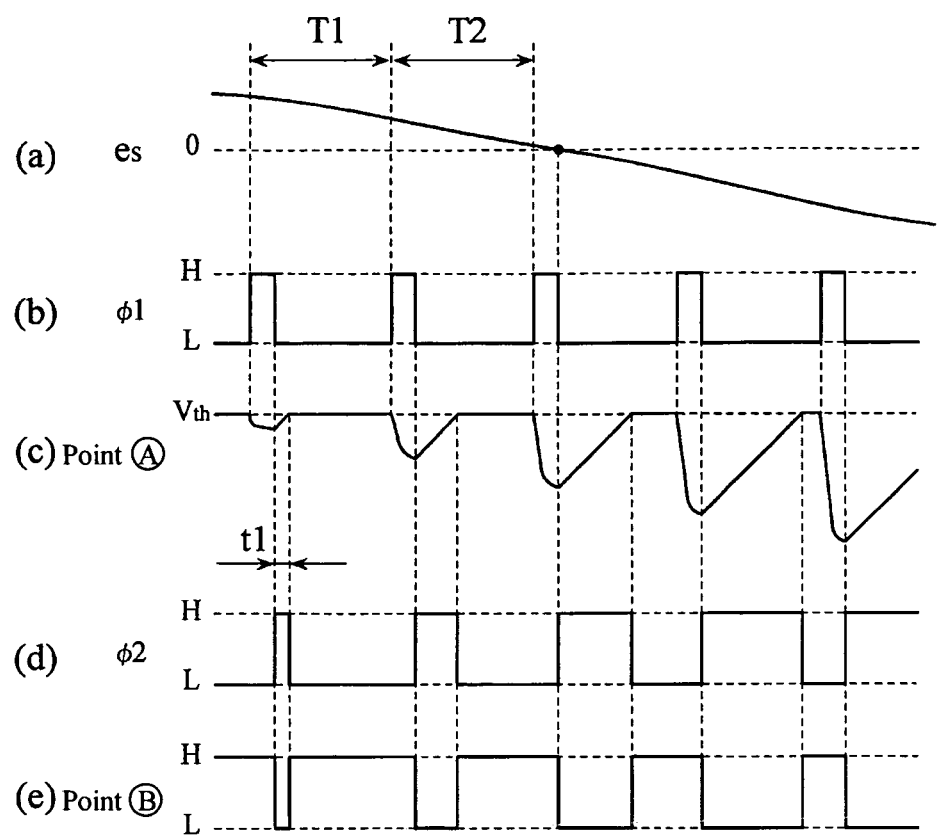
FIGS. 4A to 4E are timing charts showing voltage waveforms of signals for the case in which the audio signal is varied.

The first switch SW1 is operated to ON for charging the charging circuit 13 in the minus direction. The first switch SW1 is operated to ON/OFF based on the first switching signal φ1 which is output from the clock generation circuit 11. Specifically, as shown in FIG. 3B, the first switch SW1 is operated to ON when the first switching signal φ1 is in a high level state and is operated to OFF when the first switching signal φ1 is in a low level state.

The second switch SW2 is operated to ON for discharging charge accumulated in the charging circuit 13 in a plus direction, using a discharge bias current Id which is supplied by the discharge bias current source 16. The second switch SW2 is operated to ON/OFF based on a second switching signal φ2 which is an output from the first NOR circuit 14. Specifically, as shown in FIG. 3D, the second switch SW2 is operated to ON when the second switching signal φ2 is in a high level state and is operated to OFF when the second switching signal φ2 is in a low level state.

The charging circuit 13 is a circuit configured by a charge capacitor and charged by a predetermined charge being accumulated therein and discharged by the charge being emitted therefrom. Specifically, the charging circuit 13 is charged in the minus direction by a voltage drawn by the buffer amplifier circuit 12 by the first switch SW1 being operated to ON (at this time, the second switch SW2 is operated to OFF). Also, the charging circuit 13 is discharged in the plus direction by a charge at the one end of the charging circuit 13 flowing through the discharge bias current source 16 by the second switch SW2 being operated to ON (at this time, the first switch SW1 is operated to OFF).

Now, a circuit connection configuration of the charging circuit 13 related to charging and discharging will be described. One end of the first switch SW1 is connected to the buffer amplifier circuit 12 and the other end of the first switch SW1 is connected to the one end (see point A in FIG. 2) of the charging circuit 13, whereby a charge path in the minus direction of the charging circuit 13 is formed. Note that the other end of the charging circuit 13 is connected to the ground potential. The one end of the charging circuit 13 is also connected to one end of the second switch SW2 and the other end of the second switch SW2 is connected to the discharge bias current source 16, whereby a discharge path in the plus direction of the charging circuit 13 is formed.

The first NOR circuit 14 is a circuit for causing the second switch SW2 to be operated to ON/OFF, based on the first switching signal φ1 and charge accumulated in the charging circuit 13, and defining, at an output thereof, a pulse width of the PWM signal PWMout and outputting the PWM signal PWMout. To one input terminal of the first NOR circuit 14 is input the first switching signal φ1 from the clock generation circuit 11, and to the other input terminal of the first NOR circuit 14 is connected the one end of the charging circuit 13 and is thereby input a voltage at the one end of the charging circuit 13.

The first NOR circuit 14 computes the NOR of the first switching signal φ1 and a charged voltage level of the charging circuit 13 and thereby outputs a high level during time t1 (see FIG. 3C) starting from when discharging of the charging circuit 13 in the plus direction starts to when the charging circuit 13 reaches a threshold voltage Vth (the time t1 corresponds to the "second period" recited in the claims). The first NOR circuit 14 outputs a low level during time t2 (see FIG. 3C) starting from when the charging circuit 13 is maintained at the threshold voltage Vth to when discharging of the charging circuit 13 in the plus direction starts again.

To an output terminal of the first NOR circuit 14 are connected the second switch SW2 and one input terminal of the second NOR circuit 15. The second NOR circuit 15 is a circuit for inverting the phase of an input signal. To the one input terminal of the second NOR circuit 15 is input an output from the first NOR circuit 14, and to the other input terminal of the second NOR circuit 15 is always input a low level. An output terminal (see point B in FIG. 2) of the second NOR circuit 15 is connected, as the PWM signal PWMout, to the switching circuit 2 (see FIG. 1) of a subsequent stage thereto.

The second NOR circuit 15 computes the NOR of an output from the first NOR circuit 14 and a low level signal (fixed value) and thereby inverts the output from the first NOR circuit 14, outputs a low level during the time t1, and outputs a high level during the time t2.

The discharge bias current source 16 is a circuit for converting a positive power source voltage [+V] supplied thereto, to the discharge bias current Id. As will be described later, the discharge bias current source 16 is connected to the charging circuit 13 through the second switch SW2 and supplies the discharge bias current Id to the charging circuit 13 to discharge the charging circuit 13 in the plus direction at a constant discharge amount.

The current bypass circuit 17 includes a diode D1 and a voltage source 18. The current bypass circuit 17 is a circuit for supplying the discharge current Id from the discharge bias current source 16 to the voltage source 18 when the charging circuit 13 is not charged in the minus direction based on the audio signal $e_S$ and is not discharged in the plus direction by the discharge bias current source 16 (i.e., a period during which the charging circuit 13 is maintained at the threshold voltage Vth). Note that the voltage of the voltage source 18 is set to a value lower than that of the power source voltage of the discharge bias current source 16.

FIGS. 3A to 3E and 4A to 4E are timing charts of signals in the pulse width modulation circuit 1. Note that FIGS. 3A to 3E show the case in which the audio signal $e_S$ is a no-signal ($e_S$=0) and FIGS. 4A to 4E show the case in which the audio signal $e_S$ is varied.

During the first period T1 in FIG. 3A to 3E, when the first switching signal φ1 from the clock generation circuit 11 goes to the high level (see FIG. 3B), the first switch SW1 is operated to ON. Thus, the charging circuit 13 is in turn connected to the buffer amplifier circuit 12 and a current is drawn by the buffer amplifier circuit 12, whereby the charging circuit 13 is instantaneously charged in the minus direction (see a waveform at the point A in FIG. 3C). The charging in the minus direction is continuously performed until the first switching signal φ1 is inverted from the high level to the low level, i.e., until the first switch SW1 is operated to OFF.

When the first switching signal φ1 is inverted from the high level to the low level, the first switch SW1 is operated to OFF. Since the first switching signal φ1 is input to the one input terminal of the first NOR circuit 14, an output (second switching signal φ2) from the first NOR circuit 14 transitions from the low level to the high level (see FIG. 3D). Therefore, the second switch SW2 is operated to ON and the one end of the charging circuit 13 is in turn connected to the discharge bias current source 16, whereby the charging circuit 13 is discharged in the plus direction at a constant discharge amount by the discharge current Id (see the period t1 of the waveform at the point A).

Thereafter, when the voltage obtained as a result of the discharging of the charging circuit 13 in the plus direction reaches the threshold voltage Vth, the other input terminal of the first NOR circuit 14 (the one end of the charging circuit 13) transitions from the low level to the high level. Accordingly, the output (second switching signal φ2) from the first NOR circuit 14 transitions from the high level to the low level. Therefore, the second switch SW2 is operated to OFF and the one end of the charging circuit 13 is in turn connected only to the other input terminal of the first NOR circuit 14. Hence, the one end of the charging circuit 13 is maintained at the threshold voltage Vth. Note that at this time the discharge bias current source 16 is connected to the voltage source 18 through the diode D1 and thus the discharge current Id flows through the voltage source 18.

Since the first NOR circuit 14 and the low level terminal are connected to the input terminals of the second NOR circuit 15, when the output (second switching signal φ2) from the first NOR circuit 14 goes to the low level, an output from the second NOR circuit 15 goes to the high level and this output is output, as the PWM signal PWMout, to the switching circuit 2 (see a waveform at the point B in FIG. 3E).

When a predetermined period of time has elapsed from when the charging circuit 13 is maintained at the threshold voltage Vth, the next second period T2 starts. Specifically, the first switching signal φ1 transitions from the low level to the high level, whereby the first switch SW1 is operated to ON and a current is drawn into the charging circuit 13 by the buffer amplifier circuit 12, whereby the charging circuit 13 is charged in the minus direction. Thereafter, the same operations as those described above, i.e., charging in the minus direction and discharging in the plus direction, are alternately performed.

As shown in FIGS. 4A to 4E, when the audio signal $e_S$ is varied, as shown particularly in the first and second periods T1 and T2, when the audio signal $e_S$ has a positive value, the current is small and thus the slope of the voltage waveform at the one end (point A) of the charging circuit 13 is smaller than the case in which the audio signal $e_S$ is a no-signal. Thus, the terminal voltage of the charging circuit 13 at the time of inversion of the level of the first or second switching signal φ1, φ2 is higher than the case in which the audio signal $e_S$ is a no-signal. When the charging circuit 13 is discharged in the plus direction, the time t1 starting from when the discharging starts to when the charging circuit 13 reaches the threshold voltage Vth is reduced as compared with the case in which the audio signal $e_S$ is a no-signal. Therefore, as shown by a waveform at the point B in FIG. 4E, the PWM signal PWMout having a longer high level period than that for the case shown in FIGS. 3A to 3E in which the audio signal $e_S$ is a no-signal, is output. As such, the PWM signal PWMout according to the amplitude of the audio signal $e_S$ is output.

When the audio signal $e_S$ has a negative value, the current is large and thus the slope of the voltage waveform at the one end of the charging circuit 13 is larger than the case in which the audio signal $e_S$ is a no-signal. Thus, the terminal voltage of the charging circuit 13 at the time of inversion of the level of the first or second switching signal φ1, φ2 is lower than the case in which the audio signal $e_S$ is a no-signal. Accordingly, the time t1 starting from when the discharging starts to when the charging circuit 13 reaches the threshold voltage Vth is increased as compared with the case in which the audio signal $e_S$ is a no-signal. Therefore, as shown by the waveform at the point B, the PWM signal PWMout having a shorter high level period than that for the case shown in FIGS. 3A to 3E in which the audio signal $e_S$ is a no-signal, is output.

Figure 6:
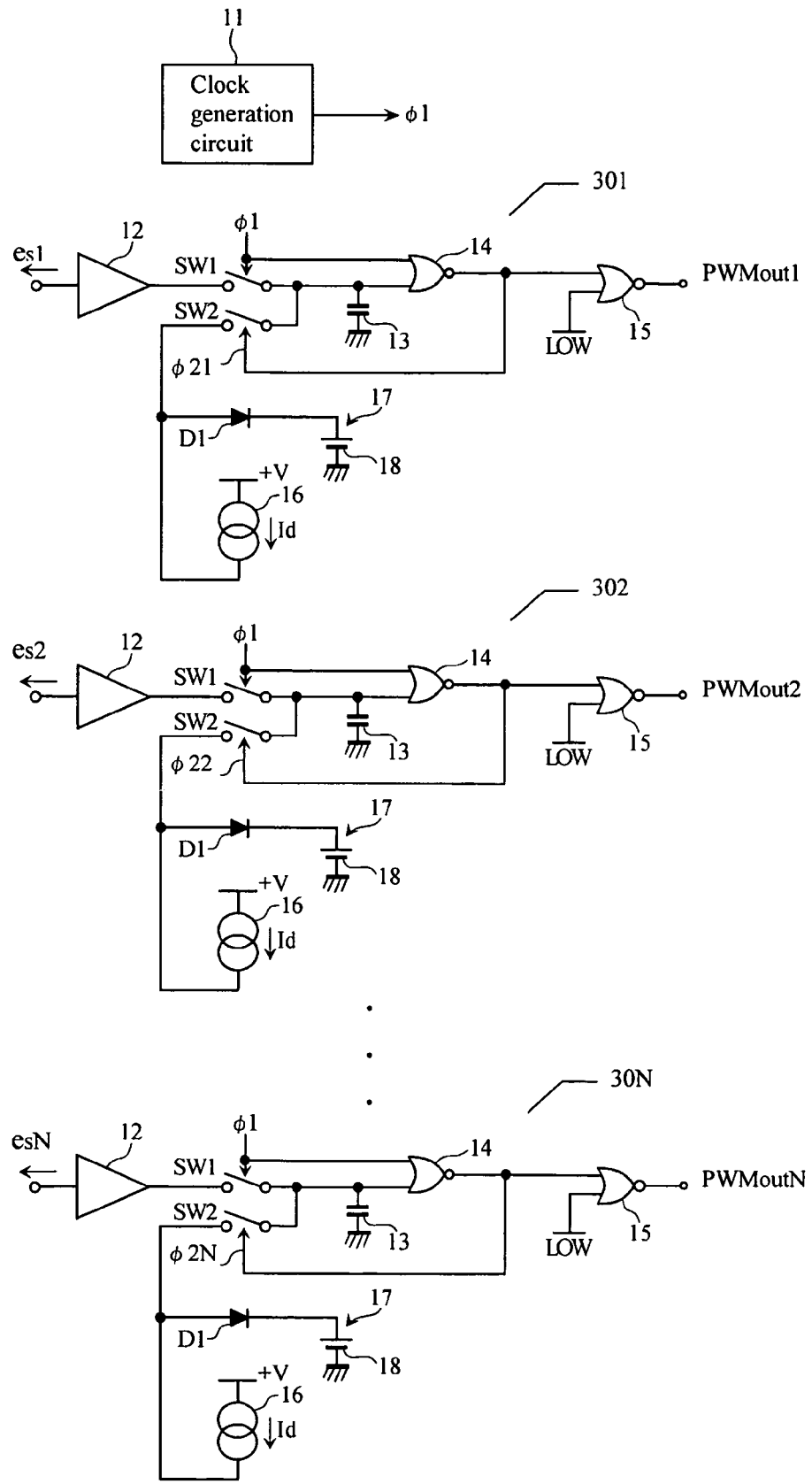
FIG. 6 is a block circuit diagram showing one embodiment of the pulse width modulation circuit suitable for a multi-channel switching amplifier.
Figure 7:
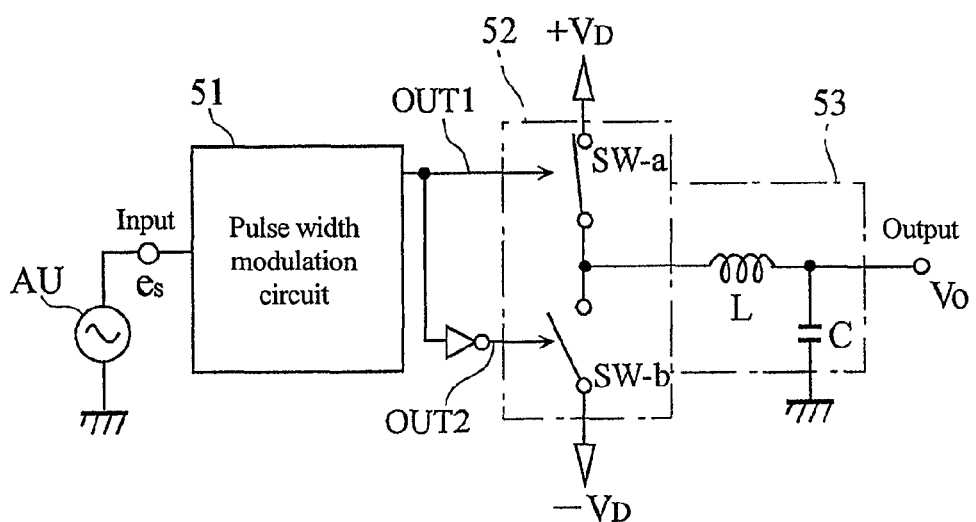
FIG. 7 is a configuration diagram showing a switching amplifier to which a conventional pulse width modulation circuit is applied.

An embodiment of the pulse width modulator circuit suitable for a multi-channel switching amplifier is shown in FIG. 6. The pulse width modulator circuit of this embodiment comprises a plurality of pulse width modulator circuits (301, 302, . . . , 30N) and a single of clock generation circuit 11. Each of the pulse width modulator circuits (301, 302, . . . , 30N) responds to each of audio signals ($e_S1, e_S2, \ldots, e_SN$), and outputs each of PWM signals (PWMout1, PWMout2, . . . , PWMoutN) to each of switching circuits (not shown).

The clock generation circuit provides the first switching signal φ1 to each first switch SW1 of the pulse width modulator circuits (301, 302, . . . , 30N). Therefore, each first period T1 and/or second period T2 of the pulse width modulator circuits (301, 302, . . . , 30N) become equal, and a carrier frequency of each pulse width modulator circuit becomes same among the channels.

Figure 5:
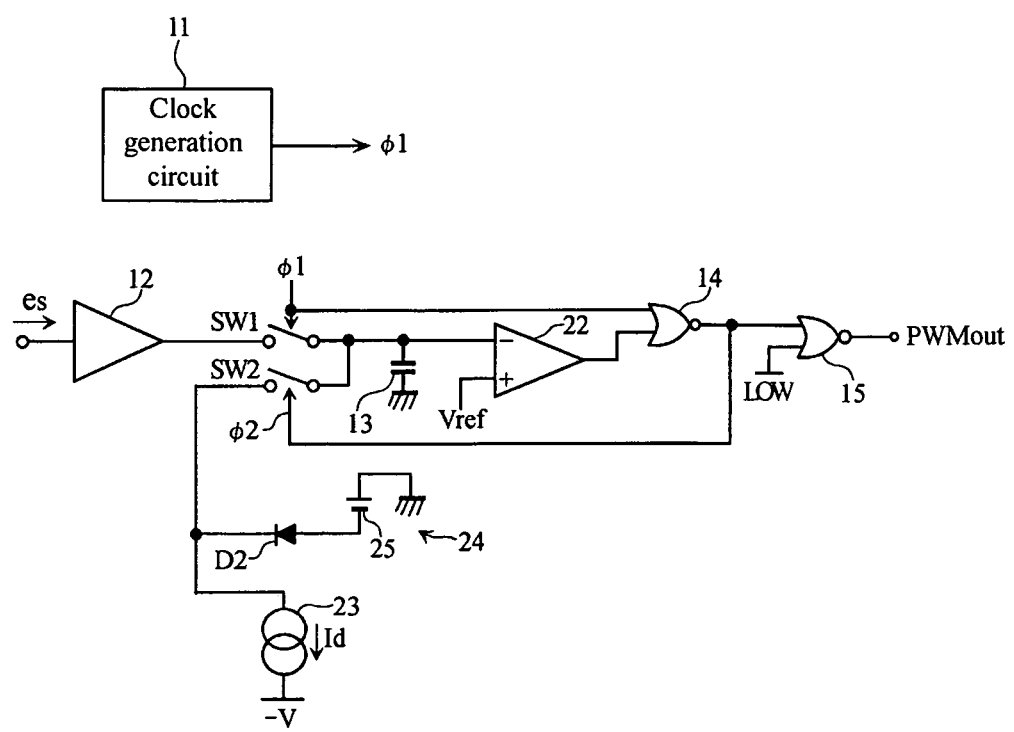
FIG. 5 is a block circuit diagram showing a variant of the pulse width modulation circuit.

In addition, a circuitry shown in FIG. 5 as other circuitries of each pulse width modulator circuit can be used.

As such, by converting voltage information based on the audio signal $e_S$ to time information and allowing the time information to correspond to the pulse-off period, the pulse width of the PWM signal PWMout can be appropriately generated. Thus, when the pulse width modulation circuit 1 is applied to a multi-channel switching amplifier, the pulse width modulation circuit 1 can perform a pulse width modulation in synchronization with the first switching signal φ1. Since the same first switching signal φ1 can be input to each channel, for example, even when the audio signal $e_S$ is input, the carrier frequency f does not vary slightly among different channels and thus it is possible to suppress mixing of a beat component between signals (carriers) to be modulated in the audio frequency component.

Figure 8:
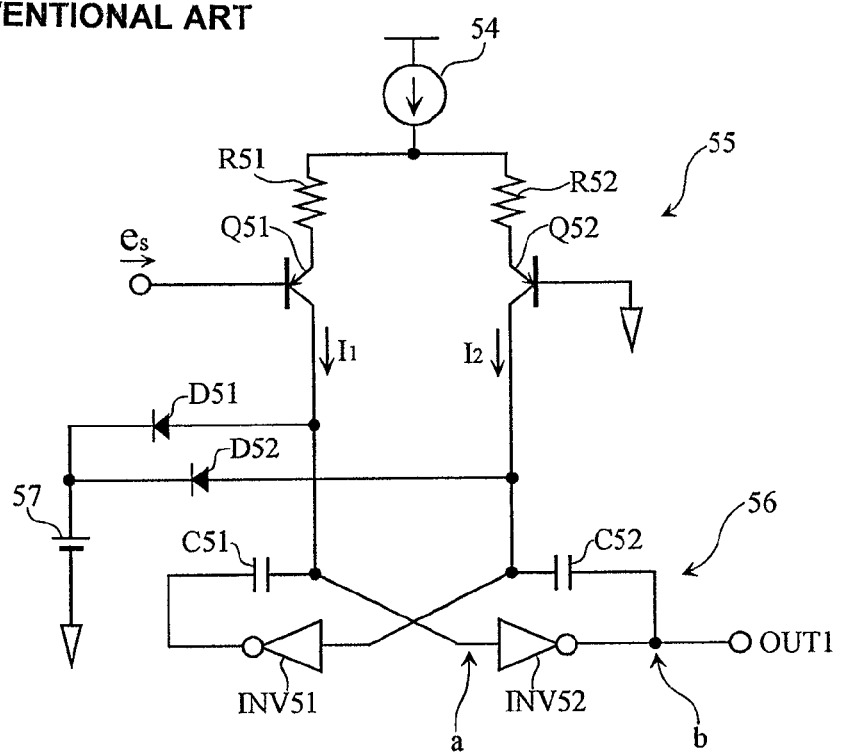
FIG. 8 is a circuit diagram showing the conventional pulse width modulation circuit.

In the conventional pulse width modulation circuit 51 (see FIG. 8), when the next charging is started without accumulated charge in capacitors C51 and C52 being sufficiently discharged in conversion of the audio signal to a PWM signal, error in the conversion occurs.

On the other hand, in the pulse width modulation circuit 1 according to the present embodiment, after charging in the minus direction and discharging in the plus direction, the voltage of the charging circuit 13 is maintained at the threshold voltage Vth. Hence, it is possible to avoid the error in conversion, and to perform an appropriate pulse width modulation and thus good sound quality can be obtained.

Further, in the present embodiment, the audio signal $e_S$ as an input signal is input in the form of a voltage, whereby the charging circuit 13 can be directly and instantaneously charged in the minus direction. Then, after that, by detecting the discharging time in the plus direction in the charging circuit 13, the PWM signal PWMout can be obtained.

Thus, an appropriate PWM signal PWMout can be obtained with a single simple circuit configuration. Accordingly, with the pulse width modulation circuit 1, it is possible to suppress the circuit size of the pulse width modulation circuit 1 from becoming relatively large and suppress an increase in component costs and an increase in mounting space when the pulse width modulation circuit 1 is mounted on a board.

FIG. 5 is a block circuit diagram showing a variant of the pulse width modulation circuit of the present invention. A pulse width modulation circuit 21 of the variant is different from the pulse width modulation circuit of the above-described embodiment in that a comparator 22 is provided; in place of the discharge bias current source 16, a discharge bias current source 23 that supplies a reverse discharge current Id is provided; and in place of the current bypass circuit 17, a current bypass circuit 24 for supplying a current to the discharge bias current source 23 is provided. The other part of the configuration is substantially the same as that in the above-described embodiment and thus in FIG. 5, components of the same functions as those of the pulse width modulation circuit 1 according to the embodiment shown in FIG. 2 are denoted by the same reference numerals.

In the pulse width modulation circuit 21, it is aimed to more accurately obtain a PWM signal PWMout by inputting a voltage at one end of a charging circuit 13 to a negative (−) side terminal of the comparator 22 to compare the voltage at the one end of the charging circuit 13 with a reference voltage Vref (which is input to a positive (+) side terminal of the comparator 22). In the pulse width modulation circuit 21, the order of charging and discharging is opposite to that in the pulse width modulation circuit 1 shown in FIG. 2, i.e., during a high-level period of a first switching signal φ1, the charging circuit 13 is charged in a plus direction and thereafter by the first switching signal φ1 going to a low level, the charging circuit 13 is discharged in a minus direction. With the pulse width modulation circuit 21 too, as with the pulse width modulation circuit 1, a reduction in the size of the circuit and a reduction in component costs can be achieved.

It should be appreciated that the scope of the present invention is of course not limited to the above-described embodiment. The circuit configuration shown in the above-described embodiment is merely an example and thus various types of circuit can be applied as long as the circuit has equivalent functionality.

What is claimed is:

1. A pulse width modulation circuit, comprising:
    a charging unit;
    a constant bias current source;
    a first voltage control unit that changes a voltage of the charging unit as a function of an input signal voltage during a first period which is in synchronization with a predetermined clock signal;
    a second voltage control unit that changes, during a second period following the first period, the voltage of the charging unit towards a predetermined voltage in an opposite direction to a direction in which the voltage is changed during the first period, by a constant bias current from the constant bias current source;
    a detecting unit that detects when the second period ends by detecting when the voltage of the charging unit reaches the predetermined voltage and stops the changing of the voltage of the charging unit by the second voltage control unit as a function of detecting when the voltage of the charging unit reaches the predetermined voltage, and that detects a time starting from when the second period starts to when the second period ends; and
    a pulse signal generating unit that generates, based on the detected time which is repeatedly output from the detecting unit for each clock signal, a pulse signal having a pulse width of the time.

2. The pulse width modulation circuit according to claim 1, wherein the first voltage control unit charges the charging unit in a minus direction with respect to a ground potential.

3. The pulse width modulation circuit according to claim 1, wherein the second voltage control unit discharges the charging unit in a plus direction with respect to the ground potential.

4. The pulse width modulation circuit according to claim 1, wherein
    the detecting unit includes a computing unit that computes NOR of the clock signal and the voltage of the charging unit, and
    the pulse signal generating unit generates the pulse signal based on an output from the computing unit.

5. The pulse width modulation circuit according to claim 1, further comprising a clock generating unit that generates the clock signal.

6. The pulse width modulation circuit according to claim 1, comprising a plurality of said pulse width modulator circuits and a single of clock generating unit, wherein the single of clock generating unit is common to the plurality of said pulse width modulator circuits.

7. A switching amplifier comprising:
    the pulse width modulation circuit according to claim 1;
    a voltage source that outputs a predetermined power source voltage; and
    a switching circuit that switches ON and OFF the predetermined power source voltage which is supplied from the voltage source, based on a modulated signal which is output from the pulse width modulation circuit.

8. The pulse width modulation circuit according to claim 1, configured wherein during the first period the first voltage control unit changes the voltage of the charging unit with the charging unit not receiving current from the constant bias current source, and during the second period the second voltage control unit changes the voltage of the charging unit with the current from the constant bias current source and not receiving current from the first voltage control unit.

9. A system comprising the pulse width modulation circuit according to claim 1, and further comprising an audio signal generation source configured to output an audio signal, the audio signal generation source being connected to the pulse width modulation circuit with the audio signal output from the audio signal generation source representing the input signal voltage.

10. A method of producing a pulse signal using the pulse width modulation circuit of claim 1, comprising:
    providing as the input signal voltage to the pulse width modulation circuit an audio signal which varies in amplitude with respect to time.

* * * * *